United States Patent
Richardson et al.

[11] Patent Number: 5,916,454
[45] Date of Patent: Jun. 29, 1999

[54] METHODS AND APPARATUS FOR REDUCING BYPRODUCT PARTICLE GENERATION IN A PLASMA PROCESSING CHAMBER

[75] Inventors: Brett C. Richardson, San Ramon; Merrill D. Crapse, Patterson; Philip Tuley, Hayward, all of Calif.

[73] Assignee: Lam Research Corporation, Fremont, Calif.

[21] Appl. No.: 08/705,974

[22] Filed: Aug. 30, 1996

[51] Int. Cl.[6] .................................................. H05H 1/00
[52] U.S. Cl. .............................. 216/67; 216/68; 156/345; 451/38; 118/723 I; 118/723 R
[58] Field of Search ........................... 118/723 I, 723 IR, 118/723 E; 156/345; 204/298.34, 298.08, 298.06; 451/38, 60, 63; 216/67, 68

[56] References Cited

U.S. PATENT DOCUMENTS

| | | | |
|---|---|---|---|
| 5,391,275 | 2/1995 | Mintz | 204/192.32 |
| 5,401,319 | 3/1995 | Banholzer et al. | 134/1 |
| 5,474,649 | 12/1995 | Kava et al. | 156/345 X |

OTHER PUBLICATIONS

Oberg, E., Jones, F., and Horton, H. *Machinery's Handbook 22nd Edition*, Jun. 1987, Industrial Press, Inc. pp. 2390–2393.

*Primary Examiner*—Thi Dang
*Attorney, Agent, or Firm*—Beyer & Weaver, LLP

[57] ABSTRACT

A method for increasing mean time between cleans (MTBC) for a plasma processing chamber configured for running a process. The method includes specifying a minimum roughness specification for a finish of a surface of a chamber interior part configured for use within the plasma processing chamber. The minimum roughness specification is selected to promote adhesion of byproduct particles produced by the process to the surface. The method further includes specifying a maximum roughness specification for a finish of a surface of a chamber interior part. The maximum roughness specification is selected to facilitate ease of cleaning of the byproduct particles using a wet clean process. The method also includes having the chamber interior part manufactured in accordance with the minimum roughness specification and the maximum roughness specification.

22 Claims, 5 Drawing Sheets

| PREFERRED RANGE (microinch) | MORE PREFERRED RANGE (microinch) | MOST PREFERRED RANGE (microinch) |
| --- | --- | --- |
| 2 - 300 | 10 - 100 | 30 - 50 |

FIG. 4

METHODS AND APPARATUS FOR REDUCING BYPRODUCT PARTICLE GENERATION IN A PLASMA PROCESSING CHAMBER

BACKGROUND OF THE INVENTION

The present invention relates to methods and apparatus for processing semiconductor wafers. More particularly, the present invention relates to methods and apparatus for improving byproduct particle control in a plasma processing chamber, thereby decreasing contamination and increasing the Mean Time Between Cleans (MTBC).

The use of plasma in processing semiconductor or glass substrates is known. In the manufacture of a semiconductor device or a flat panel display, for example, several steps involve plasma processing of a substrate. The plasma processing steps may include, for example, etching, deposition, and/or other plasma processing steps well known in the art. Some plasma processing steps produce byproduct chemical compounds which, if allowed to freely circulate within the plasma processing chamber, may cause contamination and concomitant defects in the finished product.

During plasma etching, for example, a plasma is typically created from reactant source gasses, which then react with the substrate surface to etch the desired pattern (using an appropriate photoresist or hard mask). As the reactive plasma species react with the surface of the substrate or with each other, byproducts are generated. A certain quantity of the byproducts, preferably most or all of it if possible, is exhausted away through an appropriate exhaust port of the plasma processing chamber.

Some of the byproducts, however, have a low volatility and may be deposited on inner surfaces of the plasma processing chamber. As processing continues, the byproduct deposition may build up and become a liability for particle generation. This happens when the byproduct film flakes off the chamber interior surfaces and becomes deposited as unwanted contaminants on the surface of the substrate undergoing processing. If deposited on the substrate surface, the byproduct particles may result in defects in the finished product, causing it to be rejected. For example, the deposition of unwanted particles on a substrate surface may cause electrical shorts between features which are intended to be electrically isolated from one another, or may undesirably mask areas targeted for etching. In a plasma-enhanced deposition step, the presence of unwanted contaminants on an underlying layer of a substrate may also prevent a subsequent layer from properly adhering to that underlying layer or undesirably altering the properties of the deposited film.

To keep the level of byproduct particles in a plasma processing chamber low, the chamber is opened from time to time and cleaned to remove the accumulated byproduct deposition. The frequency established for this cleaning is called the Mean Time Between Cleans (MTBC). If the deposited byproduct film flakes off readily from surfaces of the chamber interior, the Mean Time Between Cleans (MTBC) is disadvantageously shortened since a high level of contaminants may be reached in a relatively short period of time. The more frequent a plasma processing system has to be out of production for cleaning, the higher its cost of ownership, which in turn translates into higher expenses per unit produced.

In view of the foregoing, improved methods and apparatus for reducing the level of byproduct particle generation within a plasma processing chamber are desired. By reducing the level of byproduct particle generation, the contamination level within the plasma processing chamber may advantageously be maintained at an acceptable level for a longer period of time, thereby increasing the Mean Time Between Cleans (MTBC) and concomitantly reducing the system's cost of ownership.

SUMMARY OF THE INVENTION

The invention relates, in one embodiment, to a method for manufacturing a chamber interior part configured for use in a plasma processing chamber. The method includes specifying a minimum roughness specification and specifying a maximum roughness specification. The minimum roughness specification is greater than about 2 microinch, and the maximum roughness specification is less than about 300 microinch. The method further includes having the chamber interior part manufactured in accordance with the minimum roughness specification and the maximum roughness specification, whereby the minimum roughness specification is designed, for a process in the plasma processing chamber, to promote adhesion of byproduct particles generated by the process when the chamber interior part is employed in the plasma processing chamber.

In another embodiment, the invention relates to a method for reducing byproduct particle generation in a plasma processing chamber. The method includes providing a chamber interior part which has at least one surface having a roughness specification designed to promote adhesion of the byproduct particle to the surface. The method further includes having the chamber interior part installed in the plasma processing chamber.

In yet another embodiment, the invention relates to a method for increasing the mean time between cleans (MTBC) for a plasma processing chamber configured for running a particular process. The method includes specifying a minimum roughness specification for a finish of a surface of a chamber interior part configured for use within the plasma processing chamber. The minimum roughness specification is selected to promote adhesion of byproduct particles produced by the particular process to the surface. The method further includes specifying a maximum roughness specification for a finish of a surface of a chamber interior part. The maximum roughness specification is selected to facilitate ease of cleaning of the byproduct particles using a wet clean process. The method also includes having the chamber interior part manufactured in accordance with the minimum roughness specification and, optionally, the maximum roughness specification.

The minimum roughness specification is preferably greater than about 2 mincroinch. The maximum roughness specification, when used, is preferably greater than about 300 microinch.

These and other advantages of the present invention will become apparent upon reading the following detailed descriptions and studying the various figures of the drawings.

BRIEF DESCRIPTION OF THE DRAWINGS

To facilitate discussion.

To further discuss the byproduct-related contamination problem.

DETAILED DESCRIPTION OF THE PREFERRED EMBODIMENTS

An invention is described herein for reducing the level of byproduct particle generation within a plasma processing chamber. In the following description, numerous specific details are set forth in order to provide a thorough understanding of the present invention. It will be apparent, however, to one skilled in the art, that the present invention may be practiced without some or all of these specific details. In other instances, well known structures and/or process steps have not been described in detail in order not to unnecessarily obscure the present invention.

In accordance with one aspect of the present invention, the level of byproduct particle generation is advantageously reduced by increasing the adhesion ability of the deposited byproduct film to surfaces within the plasma processing chamber. In accordance with the present invention, surfaces within the plasma processing chamber are specifically designed and manufactured to have finishes of a given roughness specification, i.e., with at least a minimum level of roughness, to improve byproduct film adhesion. Since the byproduct film adheres more readily to the roughened surfaces, the amount of flaking is reduced, which extends the length of time a given plasma processing chamber can be operated before the level of byproduct particles within it exceeds an acceptable threshold.

Figure 1:
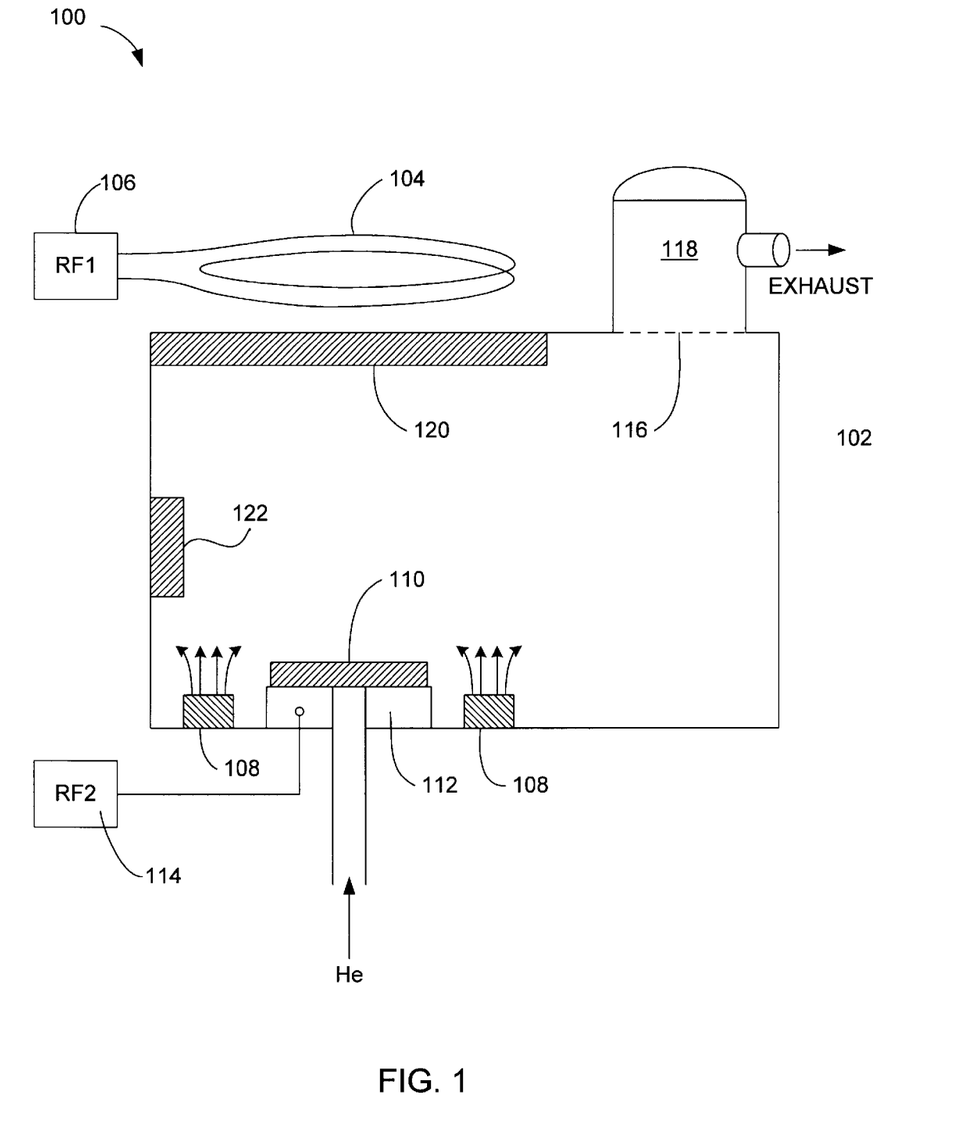
FIG. 1 illustrates a schematic diagram of a plasma etch system known as the TCP™ 9400, representing a plasma processing system suitable for use with the inventive technique for reducing byproduct particle generation.

To facilitate discussion, FIG. 1 illustrates a schematic diagram of a low pressure, high conductance plasma etch system known as the TCP™ 9400, which is available from Lam Research Corporation of Fremont, Calif. Although the TCP™ 9400 is chosen to simplify the discussion herein, it should be borne in mind that the invention is not limited to low pressure, high conductance systems, and may in fact apply to any plasma processing system, including those designed for etching, deposition, ash stripping, as well as those designed to operate without employing transformer coupled plasma.

Referring to FIG. 1, there is shown a plasma processing system 100, including a plasma processing chamber 102. Plasma processing chamber 102 may have its interior walls formed of any suitable material, e.g., anodized aluminum. Above chamber 102, there is disposed an electrode 104, which is implemented by a transformer coupled plasma (TCP™) coil in the example of FIG. 1. Electrode 104 may also be implemented in any other suitable configuration, e.g., a flat plate, if desired. Coil 104 is energized by a radio frequency (RF) system 106 via an appropriately designed matching network (conventional and omitted in FIG. 1). To provide an electrical path to ground, the chamber walls of chamber 102 are typically grounded.

Within chamber 102, there is provided a gas injection port 108, which, in the present example, represents a ring-shaped manifold having thereon a plurality of holes for releasing gaseous source materials, e.g., the etchant source gases, into the interior of chamber 102. The gaseous source materials may also be released from ports built into the walls of the chamber itself or from an appropriately designed shower head apparatus, if desired.

Substrate 110 is introduced into chamber 102 and disposed on a chuck 112, which acts as a second electrode and is preferably biased by an RF system 114 (also typically via a matching network). Chuck 112 is typically an electrostatic (ESC) chuck, which may be of a monopolar or a bipolar design, or may represent a mechanical chuck or any other suitable support structure for the work piece, i.e., substrate 110. Helium cooling gas may be introduced under pressure (e.g., about 5–10 Torr in one embodiment) between chuck 112 and substrate 110 to act as a heat transfer medium for accurately controlling the substrate's temperature during processing to ensure uniform and repeatable etching results. The pressure within chamber 102 is controlled by exhausting gas through exhaust port 116, which is coupled to a pump 118.

RF power is generated within coil 104 and inductively coupled to the plasma within chamber 102 by an RF window 120, which may be made of quartz or another suitable dielectric. A monitoring window 122 may also be provided, through which processing progress may be monitored using, e.g., an appropriate optical monitoring equipment. Chamber 102 further contains within its interior other conventional parts and structures, which are omitted from FIG. 1 to simplify the illustration. As will be seen, however, the inventive technique applies to any part suitable for roughening within chamber 102 to promote adhesion of the deposited byproduct film and to reduce the level of contaminant within the interior of chamber 102.

The byproduct particle generation problem in chamber 102 will now be discussed with reference to an exemplar etching step. During etching, etchant source gasses are injected into the interior of plasma processing chamber 102 via gas injection port 108. When RF system 106 is turned on, the RF power generated in coil 104 strikes a plasma from the injected etchant source gasses, thereby producing reactive plasma species within chamber 102. RF system 114 may also be turned on to provide RF power to chuck 112 and to bias substrate 110. The reactive plasma species then react with the surface of substrate 110 to etch away portions of substrate 110 unprotected by a protective mask (e.g., a photoresist mask), thereby forming the desired features on the substrate surface. Most of the byproducts, which are generated through the reaction between the plasma species themselves, between the plasma species and the substrate films and/or between the plasma species and the protective overlying layer (e.g., photoresist) are then exhausted through exhaust port 116.

As mentioned earlier, however, some of the less volatile byproducts may remain within plasma processing chamber 102 and become deposited on the interior surfaces of plasma processing chamber 102, the interior surfaces of RF window 120 and/or monitoring window 122, and/or on other exposed surfaces of the plasma processing chamber interior. Over time, the byproduct deposition film builds up and flakes off into the highly reactive environment within chamber 102, thereby contaminating the processing environment therein and causing defects on devices fabricated from substrate 110.

Figure 2:
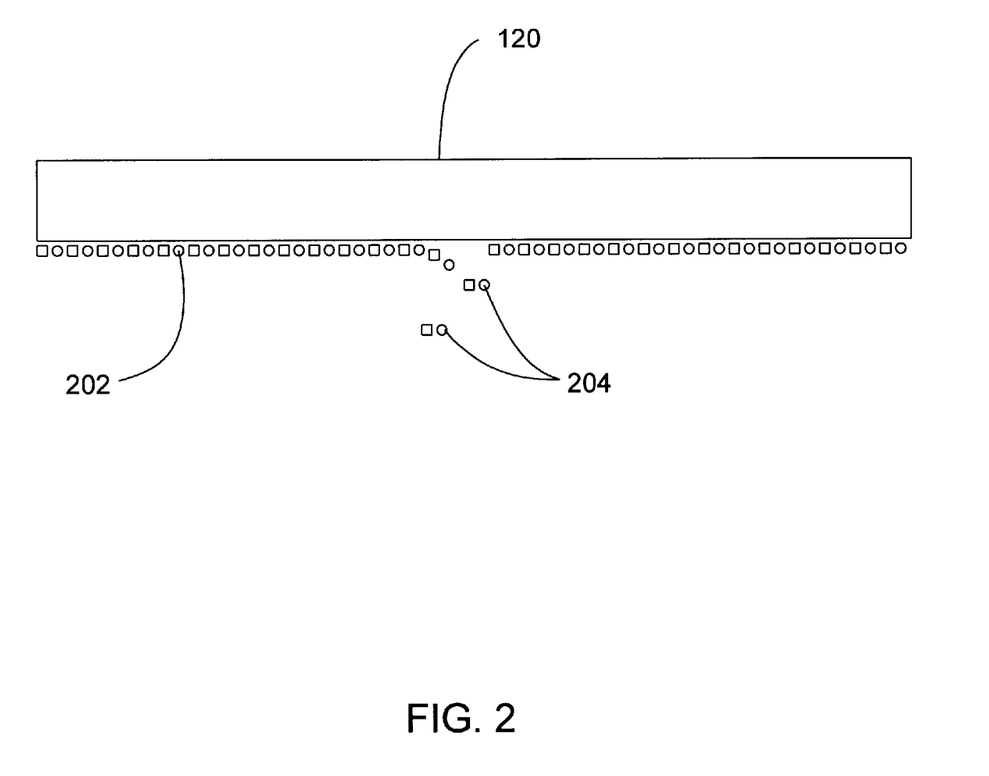
FIG. 2 illustrates in greater detail and as an example an RF window, including the byproduct film deposited on its interior surface.

To further discuss the byproduct-related contamination problem, FIG. 2 illustrates in greater detail and as an example RF window 120 having a byproduct film 202 deposited on its interior surface. The exact composition of byproduct film 202 depends, among others, on the etchant source gases employed, the composition of the layer(s) exposed to etching, and the composition of the protective masking material (e.g., photoresist). In a typical polysilicon etch, for example, etchant source gasses such as $ClO_2/N_2/O_2$, or $CL_2/HBr$ may be employed. The byproducts of this polysilicon etch step may include, for example, silicon, silicon oxide, and/or other carbon-based polymers that result from the reaction between the reactive plasma species and the photoresist layer.

Over time, deposited byproduct film 202 may be built up and byproduct particles, represented in FIG. 2 as byproduct particles 204, may flake off into the interior of the plasma processing chamber (chamber 102 of FIG. 1). As mentioned earlier, when byproduct particles land on substrate 110, they may cause contamination-related problems and concomitant defects in the finished product.

In the prior art, parts that are disposed within plasma processing chambers are typically manufactured with the maximum level of surface smoothness to achieve a tight seal with other parts and to ease the cleaning task during maintenance. Further, since a smooth surface presents a smaller surface area available for moisture adsorption, a chamber interior having smooth interior finishes tend to achieve the base pressure more rapidly when the chamber is pumped down since there is less material, e.g., moisture, vaporizing off the interior surfaces to be pumped away.

In accordance with one aspect of the present invention, it has been discovered that the prior art's approach of manufacturing chamber interior parts to be as smooth as possible contributes to the increased level of byproduct particle generation. In particular, it has been found that the deposited byproduct film adheres poorly to interior surfaces having smooth finishes, thereby allowing more byproduct particles to be flaked off, i.e., generated, within chamber 102. As deposited byproduct film 202 is built up over time, a greater number of byproduct particles may be generated within chamber 102. When this happens, the level of contaminant within chamber 102 may exceed an acceptable threshold, necessitating cleaning of the chamber interior.

In accordance with one aspect of the invention, it has been discovered that the level of byproduct particle generation can be advantageously reduced when one or more interior surfaces within chamber 102 is intentionally roughened during manufacturing to improve byproduct film adhesion when disposed in chamber 102. This novel and nonobvious approach for reducing the level of byproduct particles within chamber 102 is counter to conventional manufacturing approaches for parts configured for installation within the interior of chamber 102, i.e., making them as smooth as possible to minimize the erosion of parts, to reduce moisture adsorption, to achieve a tight fit between parts, and/or to promote ease of cleaning. The inventive approach of roughening interior surfaces to reduce byproduct particle generation is viable since it is recognized, in accordance with one aspect of the present invention, that the ease of cleaning issue may be rendered moot by using a wet clean process, e.g., using peroxide and water in one case, which cleans smooth surfaces and reasonably roughened surfaces with substantially the same degree of efficiency.

In accordance with another aspect of the present invention, it is desirable to specify in advance the desired roughness specification for surfaces of chamber interior parts. The surfaces, or portions thereof may then be manufactured to the desired roughness specification prior to being installed within the chamber interior. It is advantageous to achieve the desired level of roughness at the manufacturing stage since it is relatively simple, using conventional manufacturing techniques, such as bead blasting or chemical etching, to achieve the desired level of roughness uniformly across a surface.

Both the minimum and maximum roughness specification may be easily achieved during manufacturing using conventional non-plasma manufacturing techniques. If bead blasting is employed, for example, the level of roughness may be controlled by the size of the beads employed, the force of bead impact, the duration of blasting, and the like. Manufactured roughness is also highly controllable, allowing some portion of a given surface to be smoother than others, e.g., to achieve a good seal between adjacent parts during installation. By way of example, a portion of the interior surface of RF window 120 may be protected during bead blasting to keep that portion smooth, thereby achieving a tight seal when RF window 120 is installed in the chamber.

Chamber interior parts may also have their surfaces roughened, for the purpose of promoting byproduct particle adhesion, using a plasma manufacturing technique. By way of example, a chamber interior part may be roughened by plasma as part of its manufacturing process to promote byproduct particle adhesion when that part is installed in the target plasma processing chamber. The plasma manufacturing step may be controlled so as to conform to both a minimum and a maximum roughness specification to improve byproduct particle adhesion (and concomitant reduction in the level of byproduct particle generation) while maintaining reasonable ease of cleaning and/or low moisture adsorption.

Figure 3A:
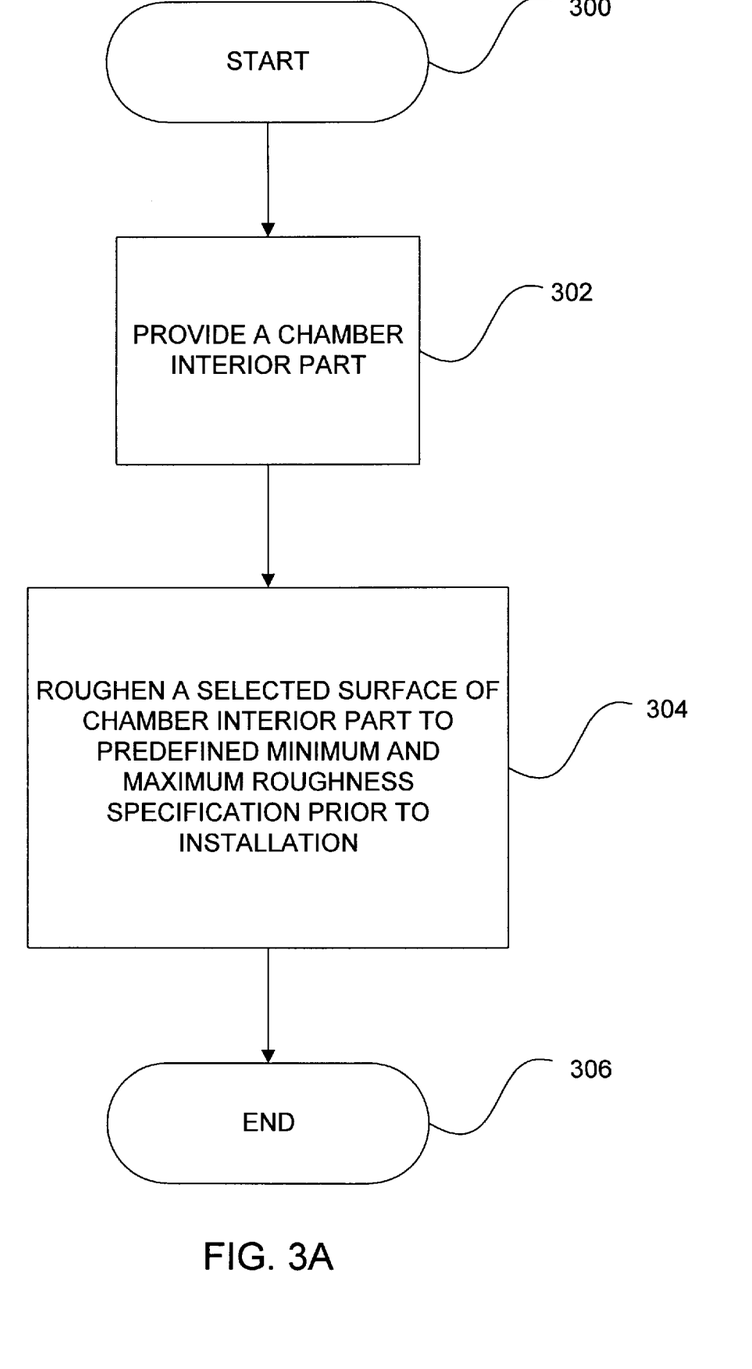
FIG. 3A is a flowchart illustrating, in accordance with one embodiment of the present invention, the steps involved in manufacturing a chamber interior part.

FIG. 3A is a flowchart illustrating, in one embodiment, the steps involved in manufacturing a chamber interior part. The chamber interior part may represent, for example, RF window 120. More advantageously, the chamber interior part also includes any of monitoring window 122, gas injection port 108, or any other part not specifically mentioned whose surface may be exposed to the interior of chamber 102, including interior walls of chamber 102 itself. In step 302, a chamber interior part is provided. The chamber interior part provided in step 302 preferably has been substantially formed and is ready for roughening.

In step 304, one or more selected surfaces (or specified portions thereof) of the chamber interior part are roughened to a predefined roughness criteria using a conventional manufacturing technique that preferably yields a high level of uniformity, e.g., bead blasting. Note that unlike prior art approaches which sought to produce as smooth a finish as possible for the chamber interior, the present invention requires that parts be manufactured to both a maximum and a minimum roughness specification. The maximum roughness specification ensures that cleaning is not made excessively difficult by finishes that are too rough. Excessively rough surfaces may also present an unduly large surface area for moisture adsorption, which may unduly increase the time required to pump the chamber down to base pressure. The minimum roughness specification advantageously ensures that byproduct film adhesion is improved. Achieving these roughness specification during manufacturing substantially simplifies the roughening process and ensuring a good degree of uniformity across the roughened surface. The roughened chamber interior part may undergo additional processing steps prior to being installed inside the plasma processing chamber.

Figure 3B:
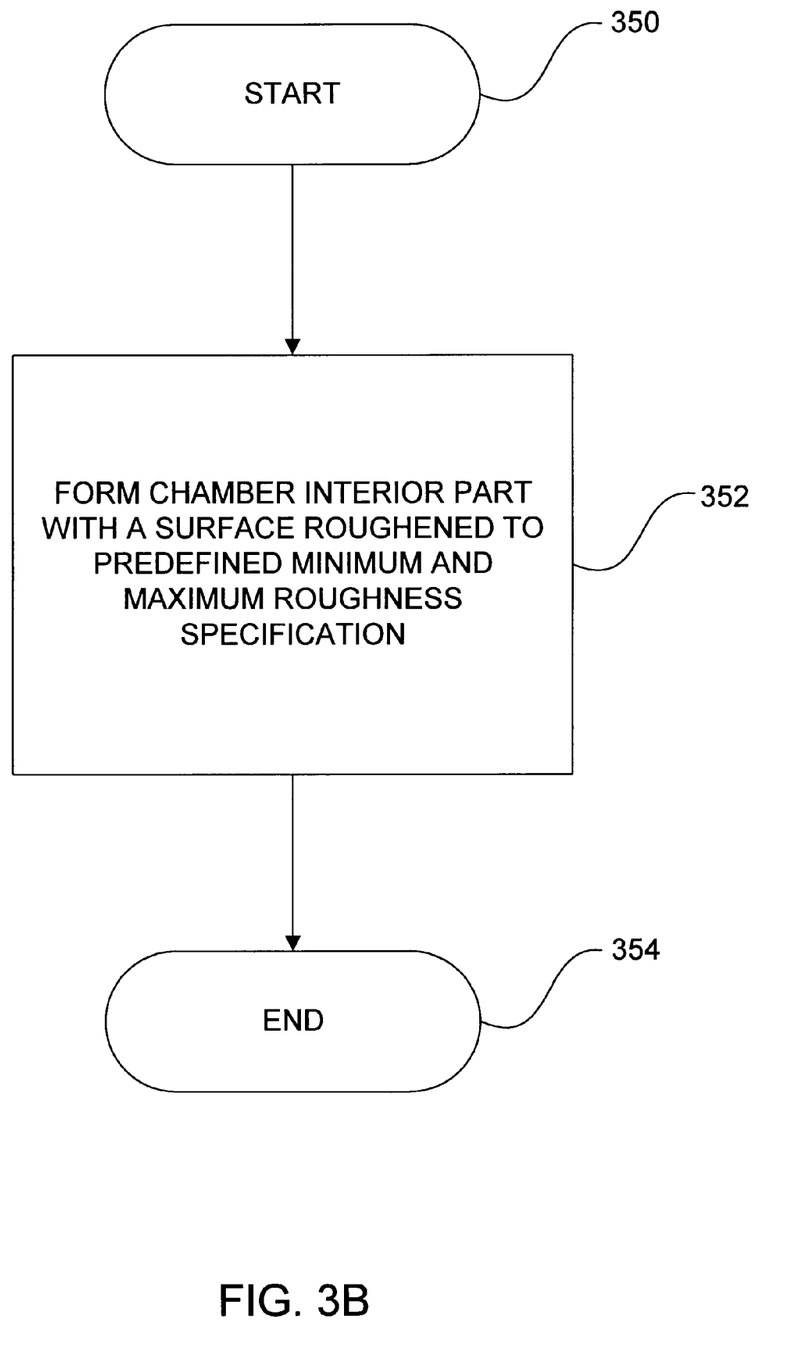
FIG. 3B is a flowchart illustrating, in an alternative embodiment of the present invention, the steps involved in forming a chamber interior part in a single manufacturing step.
Figure 4:
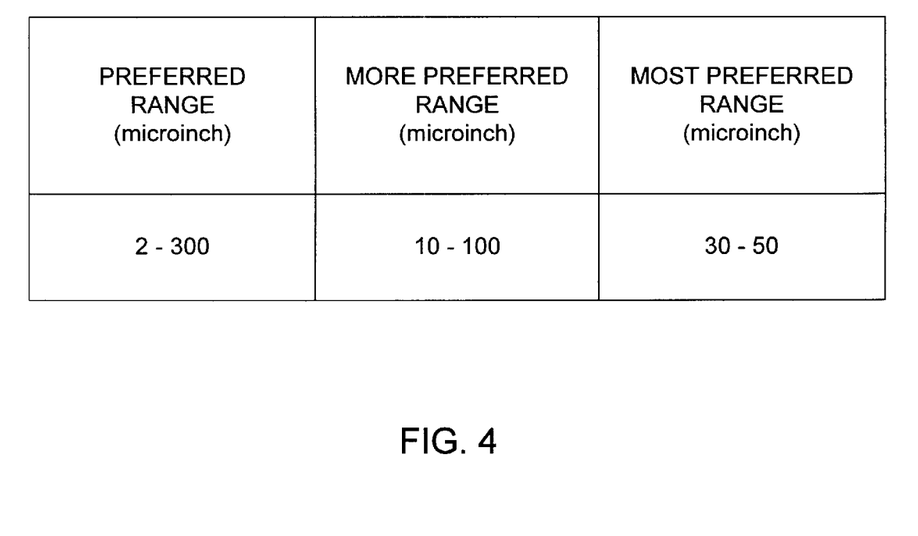
FIG. 4 illustrates, in one embodiment of the present invention, the range of minimum and maximum roughness specification for a quartz RF window.

FIG. 3B is a flowchart illustrating, in another embodiment, the steps involved in manufacturing chamber interior parts with the predefined roughness specification using the tooling itself. Unlike the embodiment of FIG. 3A wherein the chamber interior part is substantially completed before roughening, the technique of FIG. 3B forms and roughens the part in a single manufacturing step (step 352). This may be accomplished by, for example, using a tool having a roughened surface to mold and/or form the chamber interior part, thereby transferring the roughened pattern of the tool to one or more selected surfaces (or portions thereof of the part to be manufactured.

In one example, the interior surface of an RF window for the aforementioned TCP™ 9400 plasma etching system is roughened to a finish that has a minimum roughness specification of at least about 32 microinch and a maximum roughness specification of at most about 50 microinch. As is well known, roughness specification, also known as roughness average, represents the arithmetic average of the absolute values of the measured profile height deviations measured from the graphical centerline of a surface. The graphical center line is a line about which roughness is measured and is a line parallel to the general direction of the profile (i.e., the contour of the surface in a plane generally perpendicular to the surface) within the limits of the sampling length, such that the gums of the areas contained between it and those parts of the profile which lie on either side are equal. For further information regarding surface roughness or the measurement thereof, reference may be made to the Machinery's Handbook $22^{nd}$ ed., Industrial Press, Inc., New York (Fifth Printing, 1987), incorporated herein by reference. Roughness specification may be measured using any well known technique, including the use of a profilometer.

Note that the chamber interior part's surface is manufactured with not only a maximum roughness specification but also with a minimum roughness specification, which is specifically designed to promote adhesion of the deposited byproducts. The minimum roughness specification may further be tailored to promote adhesion of byproduct particles that result from a particular plasma process or particular plasma processes in the plasma processing chamber. This is substantially different from the prior art wherein chamber interior part are manufactured for maximum smoothness only (within acceptable economic constraints), and/or without a finish roughened intentionally and specifically to reduce byproduct particle generation.

It is contemplated that surfaces of chamber interior parts, such as the interior surface of RF window 120 or monitoring window 122, may be manufactured to a minimum roughness specification greater than about 2 microinch and a maximum roughness specification less than about 300 microinch. More preferably, surfaces of chamber interior parts may be manufactured to a minimum roughness specification greater than about 10 microinch and a maximum roughness specification less than about 100 microinch. Most preferably, surfaces of chamber interior parts may be manufactured to a minimum roughness specification greater than about 30 microinch and a maximum roughness specification less than about 50 microinch.

While this invention has been described in terms of several preferred embodiments, there are alterations, permutations, and equivalents which fall within the scope of this invention. Byway of example, although the inventive concept has been discussed, for ease of illustration, with reference to a quartz surface, other chamber interior surface material such as ceramics or plastics may be similarly roughened to achieved improved byproduct film adhesion. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for reducing byproduct particle generation in a plasma processing chamber, comprising:

providing a chamber window, said window having at least one surface, said one surface comprising a smooth portion and a rough portion, said smooth portion providing a tight seal when said window is installed in said chamber, and said rough portion having a roughness specification designed to promote adhesion of said byproduct particle to said rough portion of said at least one surface; and having said window installed in said plasma processing chamber.

2. The method of claim 1 wherein said roughness specification comprises a minimum roughness specification for said rough portion of said surface.

3. The method of claim 2 wherein said minimum roughness specification is greater than about 10 microinch.

4. The method of claim 3 wherein said roughness specification further comprises a maximum roughness specification for said rough portion of said surface.

5. The method of claim 4 wherein maximum roughness specification is less than about 100 microinch.

6. The method of claim 5 wherein said minimum roughness specification is greater than about 30 microinch and said maximum roughness specification is less than about 50 microinch .

7. The method of claim 6 wherein said rough portion of said at least one surface of said window is roughened by bead blasting, thereby achieving, for said rough portion of said at least one surface, a finish having said minimum roughness specification and said maximum roughness specification.

8. A method for increasing a mean time between cleans (MBTC) for a plasma processing chamber configured for running a particular process, comprising:

providing a window for said chamber, said window having an interior surface comprising a smooth portion and a rough portion, said smooth portion providing a tight seal when said window is installed in said chamber;

specifying a minimum roughness specification for said rough portion, said minimum roughness specification being selected to promote adhesion of byproduct particles produced by said particular process to said rough portion of said interior surface;

specifying a maximum roughness specification for said rough portion, said maximum roughness specification being selected to facilitate ease of cleaning said byproduct particles using a wet clean process; and having said window manufactured so that said rough portion is in accordance with said minimum roughness specification and said maximum roughness specification.

9. The method of claim 8 wherein said minimum roughness specification is greater than about 2 microinch and said maximum roughness specification is less than about 300 microinch.

10. The method of claim 8 wherein said minimum roughness specification is greater than about 10 microinch and said maximum roughness specification is less than about 100 microinch.

11. The method of claim 8 wherein said minimum roughness specification is greater than about 30 microinch and said maximum roughness specification is less than about 50 microinch.

12. The method of claim 11 wherein said rough portion of said interior surface is roughened by bead blasting, thereby achieving a surface finish having said minimum roughness specification and said maximum roughness specification.

13. The method of claim 12 wherein said window is an RF window of said plasma processing chamber.

14. A method for manufacturing a window configured for use in a plasma processing chamber, said window having an interior surface, said method comprising:

specifying a minimum roughness specification;

specifying a maximum roughness specification, said minimum roughness specification being greater than about 2 microinch and said maximum roughness specification being less than about 300 microinch;

roughening a first portion of said interior surface in accordance with said minimum roughness specification and said maximum roughness specification, where said minimum roughness specification is designed, for a process in said plasma processing chamber, to promote adhesion of byproduct particles generated by said process when said window is employed in said plasma processing chamber; and protecting a second portion of said interior surface during said roughening, said second portion being smooth to provide a seal when said window is installed in said chamber.

15. The method of claim 14 wherein said minimum roughness specification is greater than about 10 microinch and said maximum roughness specification is less than about 100 microinch.

16. The method of claim 14 wherein said minimum roughness specification is greater than about 30 microinch and said maximum roughness specification is less than about 50 microinch .

17. The method of claim 16 wherein said roughening is performed prior to said window being installed in said plasma processing chamber.

18. The method of claim 16 wherein said roughening includes a plasma manufacturing process.

19. The method of claim 16 wherein said roughening includes a non-plasma manufacturing process.

20. The method of claim 19 wherein said plasma processing chamber represents a plasma processing chamber configured for etching.

21. The method of claim 14 wherein said roughening includes bead blasting, thereby achieving a surface finish having said minimum roughness specification and said maximum roughness specification.

22. The method of claim 14 wherein said maximum roughness specification is selected to promote ease of cleaning using a wet clean process.

* * * * *